United States Patent
Parikh et al.

(10) Patent No.: US 7,161,194 B2
(45) Date of Patent: Jan. 9, 2007

(54) HIGH POWER DENSITY AND/OR LINEARITY TRANSISTORS

(75) Inventors: Primit Parikh, Goleta, CA (US); Yifeng Wu, Goleta, CA (US); Adam William Saxler, Durham, NC (US)

(73) Assignee: Cree, Inc., Durham, NC (US)

( * ) Notice: Subject to any disclaimer, the term of this patent is extended or adjusted under 35 U.S.C. 154(b) by 121 days.

(21) Appl. No.: 11/005,107

(22) Filed: Dec. 6, 2004

(65) Prior Publication Data

US 2006/0118809 A1   Jun. 8, 2006

(51) Int. Cl.
*H01L 31/00* (2006.01)
(52) U.S. Cl. .................. 257/194; 257/488
(58) Field of Classification Search .......... 257/192, 257/194, 280, 488
See application file for complete search history.

(56) References Cited

U.S. PATENT DOCUMENTS

| | | | |
|---|---|---|---|
| 4,424,525 A | 1/1984 | Mimura | |
| 4,471,366 A | 9/1984 | Delagebeaudeuf et al. | |
| 4,727,403 A | 2/1988 | Hilda et al. | |
| 4,755,867 A | 7/1988 | Cheng | |
| 4,788,156 A | 11/1988 | Stoneham et al. | |
| 4,946,547 A | 8/1990 | Palmour et al. | |
| 5,053,348 A | 10/1991 | Mishra et al. | |
| 5,172,197 A | 12/1992 | Nguyen et al. | |
| 5,192,987 A | 3/1993 | Khan et al. | |
| 5,200,022 A | 4/1993 | Kong et al. | |
| 5,210,051 A | 5/1993 | Carter, Jr. | |
| 5,296,395 A | 3/1994 | Khan et al. | |
| 5,298,445 A | 3/1994 | Asano | |
| RE34,861 E | 2/1995 | Davis et al. | |
| 5,389,571 A | 2/1995 | Takeuchi et al. | |
| 5,393,993 A | 2/1995 | Edmond et al. | |
| 5,523,589 A | 6/1996 | Edmond et al. | |
| 5,534,462 A | 7/1996 | Fiordalice et al. | |

(Continued)

FOREIGN PATENT DOCUMENTS

EP   0 334 006 A1   9/1989

(Continued)

OTHER PUBLICATIONS

Ambacher et al., "Two Dimensional Electron Gases Induced by Spontaneous and Piezoelectric Polarization Charges in N- and Ga-face AlGaN/GaN Heterostructures," *Journal of Applied Physics*. vol. 85, No. 6, pp. 3222-3233 (Mar. 1999).

(Continued)

*Primary Examiner*—Mark V. Prenty
(74) *Attorney, Agent, or Firm*—Myers Bigel Sibley & Sajovec

(57) ABSTRACT

Field effect transistors having a power density of greater than 25 W/mm when operated at a frequency of at least 4 GHz are provided. The power density may be at least 30 W/mm when operated at 4 GHz. The power density of at least 30 W/mm may be provided at a drain voltage of 120 V. Transistors with a power density of at least 30 W/mm when operated at 8 GHz are also provided. The power density of at least 30 W/mm may be provided at a drain voltage of 120 V. Field effect transistors having a power density of greater than 20 W/mm when operated at a frequency of at least 10 GHz are also provided. Field effect transistors having a power density of at least 2.5 W/mm and a two tone linearity of at least −30 dBc of third order intermodulation distortion at a center frequency of at least 4 GHz and a power added efficiency (PAE) of at least 40% are also provided.

35 Claims, 7 Drawing Sheets

U.S. PATENT DOCUMENTS

| | | | |
|---|---|---|---|
| 5,592,501 | A | 1/1997 | Edmond et al. |
| 5,686,737 | A | 11/1997 | Allen |
| 5,700,714 | A | 12/1997 | Ogilhara et al. |
| 5,701,019 | A | 12/1997 | Matsumoto et al. |
| 5,705,827 | A | 1/1998 | Baba et al. |
| 5,804,482 | A | 9/1998 | Konstantinov et al. |
| 5,885,860 | A | 3/1999 | Weitzel et al. |
| 5,946,547 | A | 8/1999 | Kim et al. |
| 5,990,531 | A | 11/1999 | Taskar et al. |
| 6,028,328 | A | 2/2000 | Riechert et al. |
| 6,046,464 | A | 4/2000 | Schetzina |
| 6,051,849 | A | 4/2000 | Davis et al. |
| 6,064,082 | A | 5/2000 | Kawai et al. |
| 6,086,673 | A | 7/2000 | Molnar |
| 6,150,680 | A | 11/2000 | Eastman et al. |
| 6,177,685 | B1 | 1/2001 | Teraguchi et al. |
| 6,177,688 | B1 | 1/2001 | Linthicum et al. |
| 6,218,680 | B1 | 4/2001 | Carter, Jr. et al. |
| 6,255,198 | B1 | 7/2001 | Linthicum et al. |
| 6,261,929 | B1 | 7/2001 | Gehrke et al. |
| 6,316,793 | B1 | 11/2001 | Sheppard et al. |
| 6,376,339 | B1 | 4/2002 | Linthicum et al. |
| 6,380,108 | B1 | 4/2002 | Linthicum et al. |
| 6,429,467 | B1 | 8/2002 | Ando |
| 6,448,648 | B1 | 9/2002 | Boos |
| 6,462,355 | B1 | 10/2002 | Linthicum et al. |
| 6,486,042 | B1 | 11/2002 | Gehrke et al. |
| 6,489,221 | B1 | 12/2002 | Gehrke et al. |
| 6,492,669 | B1 | 12/2002 | Nakayama et al. |
| 6,515,316 | B1 | 2/2003 | Wojtowicz et al. |
| 6,521,514 | B1 | 2/2003 | Gehrke et al. |
| 6,545,300 | B1 | 4/2003 | Gehrke et al. |
| 6,548,333 | B1 | 4/2003 | Smith |
| 6,570,192 | B1 | 5/2003 | Davis et al. |
| 6,582,906 | B1 | 6/2003 | Cao et al. |
| 6,582,986 | B1 | 6/2003 | Kong et al. |
| 6,586,778 | B1 | 7/2003 | Linthicum et al. |
| 6,586,781 | B1 | 7/2003 | Wu et al. |
| 6,602,763 | B1 | 8/2003 | Davis et al. |
| 6,602,764 | B1 | 8/2003 | Linthicum et al. |
| 6,608,327 | B1 | 8/2003 | Davis et al. |
| 6,621,148 | B1 | 9/2003 | Linthicum et al. |
| 6,639,255 | B1 | 10/2003 | Inoue et al. |
| 6,686,261 | B1 | 2/2004 | Gehrke et al. |
| 6,706,114 | B1 | 3/2004 | Mueller |
| 2001/0015446 | A1 | 8/2001 | Inoue et al. |
| 2001/0020700 | A1 | 9/2001 | Inoue et al. |
| 2001/0023964 | A1 | 9/2001 | Wu et al. |
| 2001/0040246 | A1 | 11/2001 | Ishii |
| 2002/0008241 | A1 | 1/2002 | Edmond et al. |
| 2002/0017696 | A1 | 2/2002 | Nakayama et al. |
| 2002/0066908 | A1 | 6/2002 | Smith |
| 2002/0079508 | A1 | 6/2002 | Yoshida |
| 2002/0119610 | A1 | 8/2002 | Nishii et al. |
| 2002/0167023 | A1 | 11/2002 | Charvarkar et al. |
| 2003/0017683 | A1 | 1/2003 | Emrick et al. |
| 2003/0020092 | A1 | 1/2003 | Parikh et al. |
| 2003/0102482 | A1 | 6/2003 | Saxler |
| 2003/0123829 | A1 | 7/2003 | Taylor |
| 2003/0145784 | A1 | 8/2003 | Thompson et al. |
| 2003/0157776 | A1 | 8/2003 | Smith |
| 2003/0213975 | A1 | 11/2003 | Hirose et al. |
| 2004/0004223 | A1 | 1/2004 | Nagahama et al. |
| 2004/0012015 | A1 | 1/2004 | Saxler |
| 2004/0021152 | A1 | 2/2004 | Nguyen et al. |
| 2004/0029330 | A1 | 2/2004 | Hussain et al. |
| 2004/0061129 | A1 | 4/2004 | Saxler et al. |
| 2004/0241970 | A1 | 12/2004 | Ring |
| 2006/0118809 | A1* | 6/2006 | Parikh et al. ............... 257/103 |

FOREIGN PATENT DOCUMENTS

| | | |
|---|---|---|
| EP | 0 563 847 A2 | 10/1993 |
| JP | 10-050982 | 2/1998 |
| JP | 11261053 | 9/1999 |
| JP | 2001230407 A | 8/2001 |
| JP | 2002016087 A | 1/2002 |
| JP | 2004-342810 | 12/2004 |
| WO | WO 93/23877 A1 | 11/1993 |
| WO | WO 01/57929 A1 | 8/2001 |
| WO | WO 03/049193 A1 | 6/2003 |
| WO | WO 04/008495 | 1/2004 |
| WO | WO 05/024909 A2 | 3/2005 |

OTHER PUBLICATIONS

Ando et al., "10-W/mm AlGaN-GaN HFET With a Field Modulating Plate," *IEEE Electron Device Letters*, 24(5), pp. 289-291 (May 2003).

Asbeck et al. "Piezoelectric charge densities in AlGaN/GaN HFETs," *Electronics Letters*. vol. 33, No. 14, pp. 1230-1231, Jul. 1997.

Beaumont, B. et al., "Epitaxial Lateral Overgrowth of GaN," *Phys. Stat. Sol.* (b) 227, No. 1, pp. 1-43 (2001).

Ben-Yaacov et al., "AlGaN/GaN Current Aperture Vertical Electron Transistors with Regrown Channels," *Journal of Applied Physics*. vol. 95, No. 4, pp. 2073-2078, Feb. 2004.

Breitschadel et al. "Minimization of Leakage Current of Recessed Gate AlGaN/GaN HEMTs by Optimizing the Dry-Etching Process," *Journal of Electronic Materials*. vol. 28, No. 12, pp. 1420-1423 (1999).

Burm et al. "Recessed Gate GaN MODFETS," *Solid-State Electronics*. vol. 41, No. 2, pp. 247-250 (1997).

Burm et al. "Ultra-Low Resistive Ohmic Contacts on *n-GaN* Using Si Implantation," *Applied Physics Letters*. vol. 70, No. 4, 464-66, Jan. 1997.

Chang et al., "AlGaN/GaN Modulation-Doped Field-Effect Transistors with an Mg-doped Carrier Confinement Layer," *Jpn. J. Appl. Phys.*, 42:3316-3319, Jun. 2003.

Chen et al. "Cl2 reactive ion etching for gate recessing of AlGaN/GaN field-effect transistors," *J. Vac. Sci. Technol. B.* vol. 17, No. 6, pp. 2755-2758, Nov. 1999.

Chini et al., "Power and Linearity Characteristics of Field-Plagted Recessed-Gate AlGaN-GaN HEMTs," *IEEE Electron Device Letters*, 25(5), pp. 229-231 (May 2004).

Cho et al., "A New GaAs Field Effect Transistor (FET) with Dipole Barrier (DIB)," *Jpn. J. Appl. Phys.* 33:775-778, Jan. 1994.

Coffie et al., Unpassivated p-GaN/AlGaN/GaN HEMTs with 7.1 W/MMF at 10 GHz, *Electronic Letters online* No. 20030872, 39(19), (Sep. 18, 2003).

Eastman et al. "GaN materials for high power microwave amplifiers," *Mat. Res. Soc. Symp. Proc.* vol. 512 (1998).

Eastman et al. "Undoped AlGaN/GaN HEMTs for Microwave Power Amplification," *IEEE Transactions on Electron Devices*. vol. 48, No. 3, pp. 479-485 (Mar. 2001).

Egawa et al. "Recessed gate ALGaN/GaN MODFET on Sapphire Grown by MOCVD," *Applied Physics Letters*. vol. 76, No. 1, pp. 121-123 (Jan. 2000).

Gaska et al. "Electron Transport in AlGaN/GaN Heterostructures Grown on 6H-SiC Substrates," *Applied Physics Letters*. vol. 72, No. 6, pp. 707-709 (Feb. 1998).

Gaska et al. "High-Temperature Performance of AlGaN/GaN HFET's on SiC Substrates," *IEEE Electron Device Letters*. vol. 18, No. 1, pp. 492-494 (Oct. 1997).

Gaska et al., "Self-Heating in High-Power AlGaN/GaN HFET's," *IEEE Electron Device Letters*, 19(3), pp. 89-91 (Mar. 1998).

Gelmont et al. "Monte Carlo simulation of electron transport in gallium nitride," *Journal of Applied Physics*. vol. 74, No. 3, pp. 1818-1821 (Aug. 1993).

Heikman et al., "Growth of Fe-Doped Semi-insulating GaN by Metalorganic Chemical Vapor Deposition," *Applied Physics Letters*. vol. 83, No. 1, pp. 439-441 (Jul. 2002).

Heikman, et al., "Mass Transport Regrowth of GaN for Ohmic Contacts to AlGaN/GaN," *Applied Physics Letters*. vol. 78, No. 19, pp. 2876, May 2001.

Heikman et al. "Polarization Effects in AlGaN/GaN and GaN/AlGaN/GaN heterostructures," *Journal of Applied Physics*. vol. 93, No. 12, pp. 10114-10118 (Jun. 2003).

Heikman, Sten J., *MOCVD Growth Technologies for Applications in AlGaN/Gan High Electron Mobility Transistors*, Dissertation, University of California—Santa Barbara, Sep. 2002, 190 pages.

Hikita et al., "350V/150A AlGaN/GaN Power HFET on Silicon Substrate With Source-via Grouding (SVG) Structure," *Electron Devices Meeting*, 2004, pp. 803-806, IEDM Technical Digest. IEEE International (Dec. 2004).

Kanaev et al., "Femtosecond and Ultraviolet Laser Irradiation of Graphitelike Hexagonal Boron Nitride," *Journal of Applied Physics*, 96(8), pp. 4483-4489 (Oct. 15, 2004).

Kanamura et al., "A 100-W High-Gain AlGaN/GaN HEMT Power Amplifier on a Conductive N-SiC Substrate for Wireless Base Station Applications," *Electron Devices Meeting*, 2004, pp. 799-802, IEDM Technical Digest. IEEE International (Dec. 2004).

Karmalkar et al. "Enhancement of Breakdown Voltage in AlGaN/GaN High Electron Mobility Transistors Using a Field Plate," *IEEE Transactions on Electron Devices*. vol. 48, No. 8, pp. 1515-1521 (Aug. 2001).

Karmalkar et al. "RESURF AlGaN/GaN HEMT for High Voltage Power Switching," *IEEE Electron Device Letters*. vol. 22, No. 8, pp. 373-375 (Aug. 2001).

Karmalkar et al., "Very High Voltage AlGaN/GaN High Electron Mobility Transistors Using a Field Plate Deposited on a Stepped Insulator," *Solid State Electronics*, vol. 45, pp. 1645-1652 (2001).

Kasahara et al., "Ka-ban 2.3W Power AlGaN/GaN Heterojunction FET," *IEDM Technical Digest*, pp. 677-680, Dec. 2002.

Khan et al., "High Electron Mobility Transistor Based on a GaN-AlxGa1_xN Heterojunction," *Applied Physics Letters*, vol. 63, No. 9, pp. 1214-1215 (Aug. 20, 1993).

Komiak et al., "Fully Monolithic 4 Watt High Efficiency Ka-band Power Amplifier," *IEEE MTT-S International Microwave Symposium Digest*, vol. 3, pp. 947-950 (1999).

Küsters et al., "Double-Heterojunction Lattice-Matched and Pseudomorphic InGaAs HEMT with δ-Doped InP Supply Layers and p-InP Barier Enhancement Layer Grown by LP-MOVPE," *IEEE Electron Device Letters*, 14(1), (Jan. 1993).

Kuzmik et al. "Annealing of Schottky contacts deposited on dry etched AlGaN/GaN," *Semiconductor Science and Technology*. vol. 17, No. 11 (Nov. 2002).

Manfra et al., "Electron Mobility Exceeding 160 000 $cm^2/V$ s in AlGaN/GaN Heterostructures Grown by Molecular-beam Epitaxy," *Applied Physics Letters*, 85(22), pp. 5394-5396 (Nov. 29, 2004).

Manfra et al., "High Mobility AlGaN/GaN Heterostructures Grown by Plasma-assisted Molecular beam epitaxy on Semi-Insulating GaN Templates Prepared by Hydride Vapor Phase Epitaxy," *Journal of Applied Physics*, 92(1), pp. 338-345 (Jul. 1, 2002).

Manfra et al., "High-Mobility AlGaN/GaN Heterostructures Grown by Molecular-beam Epitaxy on GaN Templates Prepared by Hydride Vapor Phase Epitaxy," *Applied Physics Letters*, 77(18), pp. 2888-2890 (Oct. 30, 2000).

Neuburger et al. "Design of GaN-based Field Effect Transistor Structures based on Doping Screening of Polarization Fields," WA 1.5, 7th Wide-Gandgap III-Nitride Workshop (Mar. 2002).

Ping et al. "DC and Microwave Performance of High-Current AlGaN/GaN Heterostructure Field Effect Transistors Grown on p-Type SiC Substrates," *IEEE Electron Device Letters*. vol. 19, No. 2, pp. 54-56 (Feb. 1998).

Saxler et al., "III-Nitride Heterostructures on High-Purity Semi-Insulating 4H-SiC Substrates for High-Power RF Transistors," International Workshop on Nitride Semiconductors (Jul. 19, 2004).

Sheppard et al. "High Power Demonstration at 10 GHz with GaN/AlGaN HEMT Hybrid Amplifiers." Presented at the 58th DRC, Denver, CO, Jun. 2000.

Sheppard et al. "Improved 10-GHz Operation of GaN/AlGaN HEMTs on Silicon Carbide," *Materials Science Forum*. vols. 338-342, pp. 1643-1646, (2000).

Shen et al., "High-Power Polarization-Engineered GaN/AlGaN/GaN HEMTs Without Surface Passivation," *IEEE Electronics Device Letters*. vol. 25, No. 1, pp. 7-9, Jan. 2004.

Shiojima et al., "Improved Carrier Confinement by a Buried p-Layer in the AlGaN/GaN HEMT Structure," *IEICE Trans. Electron.*, E83-C(12), (Dec. 2000).

Sriram et al. "RF Performance of AlGaN/GaN MODFET's on High Resistivity SiC Substrates," Presentation at Materials Research Society Fall Symposium, 1997.

Sriram et al. "SiC and GaN Wide Bandgap Microwave Power Transistors," *IEEE Sarnoff Symposium*, Pittsburgh, PA, Mar. 18, 1998.

Sullivan et al. "High-Power 10-GHz Operation of AlGaN HFET's on Insulating SiC," *IEEE Electron Device Letters*. vol. 19, No. 6, pp. 198-200 (Jun. 1998).

"Thick AlN template on SiC substrate—Novel semi insulating substrate for GaN-based devices," © 2003 by TDI, Inc., http://www.tdii.com/products/AIN_SiCT.html.

Tilak et al., "Influence of Barrier Thickness on the High-Power Performance of AlGaN/Gan HEMTs," *IEEE Electron Device Letters*, 22(11), pp. 504-506 (Nov. 2001).

"Improved Dielectric Passivation for Semiconductor Devices," U.S. Appl. No. 10/851,507, filed May 22, 2004.

"Wide Bandgap Transistor Devices With Field Plate," U.S. Appl. No. 10/930,160, filed Aug. 31, 2004.

"Cascode Amplifier Structures Including Wide Bandgap Field Effect Transistor With Field Plate," U.S. Appl. No. 10/856,098, filed May 28, 2004.

"Nitride-Based Transistors and Methods of Fabrication Thereof Using Non-Etched Contact Recesses," U.S. Appl. No. 10/617,843, filed Jul. 11, 2003.

"Nitride-Based Transistors with a Protective Layer and a Low-Damage Recess and Methods of Fabrication Thereof," U.S. Appl. No. 10/758,871, filed Jan. 16, 2004.

"Co-Doping for Fermi Level Control in Semi-Insulating Group III Nitrides," U.S. Appl. No. 10/752,970, filed Jan. 7, 2004.

"Cap Layers and/or Passivation Layers for Nitride-Based Transistors, Transistor Structures and Methods of Fabricating the Same," U.S. Appl. No. 10/996,249, filed Nov. 23, 2004.

"Methods of Having Laterally Grown Active Region and Methods of Fabricating Same," U.S. Appl. No. 10/899,215, filed Jul. 26, 2004.

"Silicon Carbide on Diamond Substrates and Related Devices and Methods," U.S. Appl. No. 10/707,898, filed Jan. 22, 2004.

"Nitride Heterojunction Transistors Having Charge-Transfer Induced Energy Barriers and Methods of Fabricating the Same," U.S. Appl. No. 10/772,882, filed Feb. 5, 2004.

"Methods of Fabricating Nitride-Based Transistors with a Cap Layer and a Recessed Gate," U.S. Appl. No. 10/897,726, filed Jul. 23, 2004.

"Semiconductor Devices Having a Hybrid Channel Layer Current Aperture Transistors and Methods of Fabricating Same" U.S. Appl. No. 10/849,589, filed May 20, 2004.

"Methods of Fabricating Nitride-Based Transistors Having Regrown Ohmic Contact Regions and Nitride-Based Transistors Having Regrown Ohmic Contact Regions," U.S. Appl. No. 10/849,617, filed May 20, 2004.

"Field Effect Transistors (FETS) Having Multi-Watt Output Power at Millimeter-Wave Frequencies," U.S. Appl. No. 11/005,423, filed Dec. 6, 2004.

"Group III Nitride Field Effect Transistors (FETs) Capable of Withstanding High Temperature Reverse Bias Test Conditions," U.S. Appl. No. 11/080,905, filed Mar. 15, 2005.

"Aluminum Free Group III-Nitride Based High Electron Mobility Transistors and Methods of Fabricating Same," U.S. Appl. No. 11/118,575, filed Apr. 29, 2005.

"Binary Group III-Nitride Based High Electron Mobility Transistors and Methods of Fabricating Same," U.S. Appl. No. 11/118,675, filed Apr. 29, 2005.

"Composite Substrates of Conductive And Insulating or Semi-Insulating Group III-Nitrides For Group III-Nitride Devices," U.S. Appl. No. 11/103,127, filed Apr. 11, 2005.

"Thick Semi-Insulating or Insulating Epitaxial Gallium Nitride Layers and Devices Incorporating Same," U.S. Appl. No. 11/103,117, filed Apr. 11, 2005.

Walker, J. L. B. (Ed.), *High Power GaAs FET Amplifiers*, Norwood, MA: Artech House, pp. 119-120 (1993).

Wu et al., "3.5-Watt AlGaN/GaN HEMTs and Amplifiers at 35 GHz," IEDM-2003, Cree, Inc, Dec. 2003.

Wu et al., "30-W/mm GaN HEMTs by Field Plate Optimization," *IEEE Electron Device Letters*, 25(3), pp. 117-119 (Mar. 2004).

Wu et al., "Bias-dependent Performance of High-Power AlGaN/GaN HEMTs," *IEDM Technical Digest*, p. 378-380 (2001).

Wu et al. "High Al-Content AlGaN/GaN MODFET's for Ultrahigh Performance," *IEEE Electron Device Letters*. vol. 19, No. 2, pp. 50-53 (Feb. 1998).

Wu et al., "Measured Microwave Power Performance of AlGaN/GaN MODFET," *IEEE Electron Device Letters*, vol. 17, No. 9, pp. 455-457 (Sep. 9, 1996).

Yu et al., "Schottky Barrier Engineering in III-V Nitrides via the Piezoelectric Effect," *Applied Physics Letters*, 73(13), pp. 1880-1882 (Sep. 28, 1998).

Zhang et al., "High Breakdown GaN HEMT with Overlapping Gate Structure," *IEEE Electron Device Letters*, 21(9), pp. 421-423 (Sep. 2000).

Parikh et al., "Development of Gallium Nitride Epitaxy and Associated Material-Device Correlation for RF, Microwave 5nd MM-wave Applications," Cree, Inc. (35 slides). May 2004.

Wu et al., "3.5-Watt AlGaN/GaN HEMTs and Amplifiers at 35 GHz," Electron Devices Meeting, 2003. IEDM '03 Technical Digest. IEEE International. Dec. 8-10, 2003.

Wu et al., "Linearity Performance of GaN HEMTs With Field Plates," Device Research Conference, 2004. 62nd DRC. Conference Digest. Jun. 21-23, 2004.

Wu et al., "Linearity Performance of GaN HEMTs With Field Plates," Device Research Conference, 2004. 62nd DRC. Jun. 21-23, 2004.

\* cited by examiner

HIGH POWER DENSITY AND/OR LINEARITY TRANSISTORS

FIELD OF THE INVENTION

The present invention relates to semiconductor devices and, more particularly, to transistors.

BACKGROUND

Materials such as silicon (Si) and gallium arsenide (GaAs) have found wide application in semiconductor devices. These, more familiar, semiconductor materials may not be well suited for higher power and/or high frequency applications, however, because of their relatively small bandgaps (e.g., 1.12 eV for Si and 1.42 for GaAs at room temperature) and/or relatively small breakdown voltages.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths and higher electron saturation velocities as compared to gallium arsenide and silicon.

A device of particular interest for high power and/or high frequency applications is the High Electron Mobility Transistor (HEMT), which, in certain cases, is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of, for example, $10^{13}$ carriers/cm$^2$. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. A major portion of the electrons in the 2DEG is attributed to polarization in the AlGaN. HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

Wide bandgap GaN-based high-electron-mobility-transistors (HEMTs) have come a long way as microwave devices since their description in 1993 in Khan et al., Appl. Phys. Lett., vol. 63, p. 1214, 1993, and a demonstration of their power capability in 1996 in Wu et al., IEEE Electron Device Lett., vol. 17, pp. 455–457, September, 1996. Many research groups have presented devices with power densities exceeding 10 W/mm, a ten-fold improvement over conventional III–V devices. See Tilak et al., IEEE Electron Device Lett., vol. 22, pp. 504–506, November, 2001; Wu et al., IEDM Tech Dig., Dec. 2–5, 2001, pp. 378–380; and Ando et al., IEEE Electron Device Lett., vol. 24, pp. 289–291, May, 2003. Much of the previous work covered material quality, choice of substrate, epi-layer structures and processing techniques. Less effort has been put on advanced device designs, leaving room for further improvement. An overlapping gate structure, or field plate, was used by Zhang et al. with GaN HEMTs for high-voltage switching applications. Zhang et al., IEEE Electron Device Lett., vol. 21, pp. 421–423, September, 2000. Following this, Karmalkar et al. performed simulations for the field plate structure, predicting up to five times enhancement in breakdown voltages. Karmalkar et al., IEEE Trans. Electron Devices, vol. 48, pp. 1515–1521, August, 2001. However, fabricated devices at that time had low cutoff frequencies, not suitable for microwave operation. Ando et al. recently used a similar structure with smaller gate dimensions and demonstrated performance of 10.3 W output power at 2 GHz using a 1-mm-wide device on a SiC substrate. Ando et al., IEEE Electron Device Lett., vol. 24, pp. 289–291, May, 2003. Chini et al. implemented a new variation of the field-plate design with further reduced gate dimensions and obtained 12 W/mm at 4 GHz from a 150-μm-wide device on a sapphire substrate. Chini et al., IEEE Electron Device Lett., vol. 25, No. 5, pp. 229–231, May, 2004.

Modern communication applications also may require high linearity for power devices. Chini et. al. reported two-tone linear power of 2.4 W/mm with PAE of 53% at 4 GHz from FP devices at a $3^{rd}$-order-intermodulation level ($IM_3$) of −30 dBc. Chini et al., IEEE Electron Device Lett., vol. 25, No. 5, pp. 229–231, May, 2004.

SUMMARY OF THE INVENTION

Some embodiments of the present invention provide field effect transistors having a power density of greater than 25 W/mm when operated at a frequency of at least 4 GHz. In some embodiments, the power density is at least 30 W/mm when operated at 4 GHz. Furthermore, the power density of at least 30 W/mm may be provided at a drain voltage of 120 V. In some embodiments, the power density is provided at a compression of not greater than 3 dB.

In still further embodiments of the present invention, the power density is at least 30 W/mm when operated at 8 GHz. The power density of at least 30 W/mm may be provided at a drain voltage of 120 V.

In particular embodiments of the present invention, the transistors are a high electron mobility transistor (HEMT). The transistors may be Group III-nitride HEMTs. The Group III-nitride HEMTs may include a GaN channel layer, an AlN layer on the GaN channel layer, an AlGaN layer on the AlN layer, a gate contact on the AlGaN layer, source and drain contacts on the AlGaN layer, an insulating layer on the gate contact and a field plate on the insulating layer that is electrically coupled to the gate contact. The field plate may have a field plate length ($L_F$) of from about 0.3 μm to about 1.1 μm. In particular embodiments, the field plate length is from 0.3–0.5 μm. In other embodiments, the field plate length is from 0.9–1.1 μm.

In some embodiments, field effect transistors having a power density of greater than 20 W/mm when operated at a frequency of at least 10 GHz is provided. The power density of greater than 20 W/mm may be provided at a drain voltage of 70 V. In some embodiments, the power density is provided at a compression of not greater than 3 dB. The transistors may be high electron mobility transistors (HEMTs). The transistors may be Group III-nitride HEMTs. The Group III-nitride HEMTs may include a GaN channel layer, an AlN layer on the GaN channel layer, an AlGaN layer on the AlN layer, a gate contact on the AlGaN layer, source and drain contacts on the AlGaN layer, an insulating layer on the gate contact and a field plate on the insulating layer that is electrically coupled to the gate contact. The field plate may have a field plate length ($L_F$) of from about 0.3 μm to about 1.1 μm. In some embodiments, the field plate length is from 0.3–0.5 μm. In other embodiments, the field plate length is from 0.9–1.1 μm.

Still further embodiments of the present invention provide field effect transistors having a power density of at least 2.5 W/mm and a two tone linearity of at least −30 dBc of third order intermodulation distortion (IM3) at a center frequency of at least 4 GHz and a power added efficiency (PAE) of at least 40%. The power density may be provided at a drain voltage of 48 V. The PAE may be at least 50%. The power density may be at least 5 W/mm, while maintaining IM3 of at least −30 dBc. The power density may be provided at a drain voltage of 108 V. In some embodiments, the linear power density is at least 10 W/mm, while maintaining IM3 of at least −30 dBc. In such a case, the power density may be provided at a drain voltage of 108 V. In some embodiments, the power density is provided at a compression of not greater than 3 dB.

In particular embodiments of the present invention, the transistors are high electron mobility transistors (HEMTs). The transistors may be Group III-nitride HEMTs. In particular embodiments, the Group III-nitride HEMTs include a GaN channel layer, an AlN layer on the GaN channel layer, an AlGaN layer on the AlN layer, a gate contact on the AlGaN layer and source and drain contacts on the AlGaN layer. The HEMT may also include an insulating layer on the gate contact and a field plate on the insulating layer that is electrically coupled to the gate contact. The field plate may have a field plate length ($L_F$) of from about 0.3 μm to about 1.1 μm. In particular embodiments, the field plate length is about 0.7 μm.

Transistors having various combinations and/or sub-combinations of transistor characteristics described above may also be provided according to some embodiments of the present invention.

DETAILED DESCRIPTION OF EMBODIMENTS OF THE INVENTION

Figure 1:
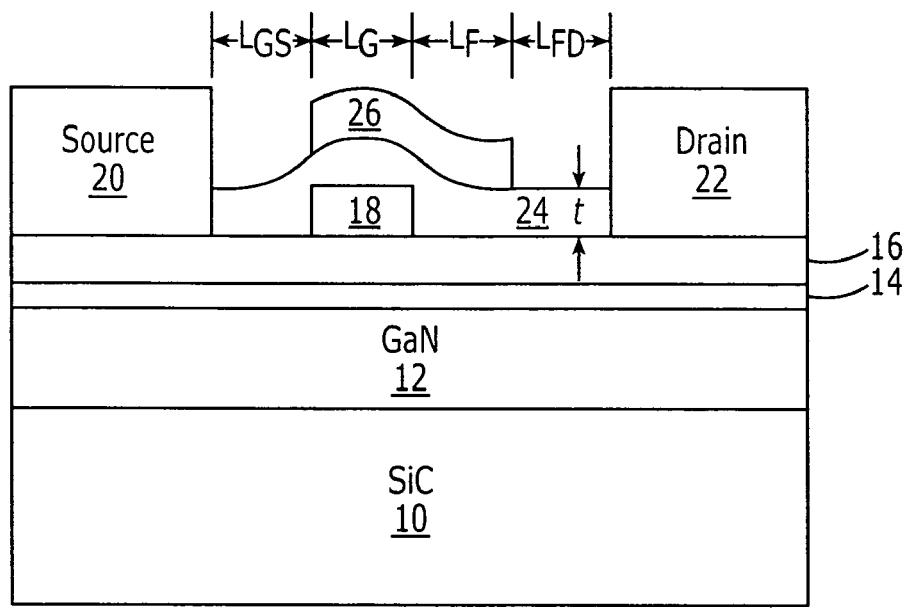
FIG. 1 is a cross-sectional diagram of a transistor according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Embodiments of the present invention may be particularly well suited for use in nitride-based devices such as Group III-nitride based HEMTs. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

While embodiments of the present invention are described with reference to particular structures, other structures and/or techniques for fabricating GaN-based HEMTs could also be utilized in some embodiments of the present invention. Such structures and/or techniques may include those described, for example, in commonly assigned U.S. Pat. No. 6,316,793 and U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. Patent Publication No. 2002/0167023A1 to Smorchkova et al., published Nov. 14, 2002, entitled "GROUP-III NITRIDE BASED HIGH ELECTRON MOBILITY TRANSISTOR (HEMT) WITH BARRIER/SPACER LAYER", U.S. patent application Ser. No. 10/617,843 filed Jul. 11, 2003 for "NITRIDE-BASED TRANSISTORS AND METHODS OF FABRICATION THEREOF USING NON-ETCHED CONTACT RECESSES," U.S. patent application Ser. No. 10/772,882 filed Feb. 5, 2004 for "NITRIDE HETEROJUNCTION TRANSISTORS HAVING CHARGE-TRANSFER INDUCED ENERGY BARRIERS AND METHODS OF FABRICATING THE SAME," U.S. patent application Ser. No. 10/897,726, filed Jul. 23, 2004 entitled "METHODS OF FABRICATING NITRIDE-BASED TRANSISTORS WITH A CAP LAYER AND A RECESSED GATE," U.S. patent application Ser. No. 10/849,617, filed May 20, 2004 entitled "METHODS OF FABRICATING NITRIDE-BASED TRANSISTORS HAVING REGROWN OHMIC CONTACT REGIONS AND NITRIDE-BASED TRANSISTORS HAVING REGROWN OHMIC CONTACT REGIONS," U.S. patent application Ser. No. 10/849,589, filed May 20, 2004 and entitled "SEMICONDUCTOR DEVICES HAVING A HYBRID CHANNEL LAYER, CURRENT APERTURE TRANSISTORS AND METHODS OF FABRICATING SAME," U.S. Patent Publication No. 2003/0020092 filed Jul. 23, 2002 and published Jan. 30, 2003 for "INSULATING GATE ALGAN/GAN HEMT", and U.S. patent application Ser. No. 10/996,249, filed Nov. 23, 2004 and entitled "CAP LAYERS AND/OR PASSIVATION LAYERS FOR NITRIDE-BASED TRANSISTORS, TRANSISTOR STRUCTURES AND METHODS OF FABRICATING SAME," the disclosures of which are incorporated herein as if described in their entirety.

Some embodiments of the present invention provide transistors having a power density of greater than 25 W/mm at a frequency of at least 4 GHz. Furthermore, the transistors may provide a power added efficiency (PAE) of a least 50% at 4 GHz and/or at least 45% at 8 GHz. Additional embodiments of the present invention provide a power density of at least 20 W/mm at a frequency of at least 10 GHz and may have a PAE of at least 50% at that frequency. In some embodiments, the power density and/or PAE are obtained with a compression of not greater than 3 dB. Some embodiments of the present invention provide a two tone linearity of at least −30 dBc of third order intermodulation distortion (IM3) at a center frequency of at least 4 GHz and a power added efficiency (PAE) of at least 40% and a power density of at least 2.5 W/mm. Two tone linearity refers to characteristics of the device when driven with a 2-tone signal with 100 kHz spacing around a center frequency, such as, for example, 4 GHz. At narrower tone spacings, a given power density and PAE are more difficult to achieve for a given IM3 value. A discussion of IM3 is provided, for example, in Walker, J. L. B. (Ed.), (1993), *High-power GaAs FET Amplifiers*, pp. 119–120, Norwood, Mass.: Artech House, the disclosure of which is incorporated herein as if set forth in its entirety.

Exemplary devices according to some embodiments of the present invention are schematically illustrated in FIG. 1. However, embodiments of the present invention should not be construed as limited to the particular exemplary embodiments described herein but may include any suitable structure that provides transistor characteristics as described herein.

Turning to FIG. 1 a substrate 10 is provided on which nitride based devices may be formed. In particular embodiments of the present invention, the substrate 10 may be a semi-insulating silicon carbide (SiC) substrate that may be, for example, 4H polytype of silicon carbide. Other silicon carbide candidate polytypes include the 3C, 6H, and 15R polytypes. The term "semi-insulating" is used descriptively rather than in an absolute sense. In particular embodiments of the present invention, the silicon carbide bulk crystal has a resistivity equal to or higher than about $1 \times 10^5$ Ω-cm at room temperature.

Optional buffer, nucleation and/or transition layers (not shown) may be provided on the substrate 10. For example, an AlN buffer layer may be provided to provide an appropriate crystal structure transition between the silicon carbide substrate and the remainder of the device. Additionally, strain balancing transition layer(s) may also be provided as described, for example, in commonly assigned U.S. Patent Publication No. 2003/0102482A1, filed Jul. 19, 2002 and published Jun. 5, 2003, and entitled "STRAIN BALANCED NITRIDE HETROJUNCTION TRANSISTORS AND METHODS OF FABRICATING STRAIN BALANCED NITRIDE HETEROJUNCTION TRANSISTORS," or United States Patent Publication No. 2004/0012015 A1, filed Jul. 19, 2002 and published Jan. 22, 2004, and entitled "STRAIN COMPENSATED SEMICONDUCTOR STRUCTURES AND METHODS OF FABRICATING STRAIN COMPENSATED SEMICONDUCTOR STRUCTURES," the disclosures of which are incorporated herein by reference as if set forth fully herein.

Appropriate SiC substrates are manufactured by, for example, Cree, Inc., of Durham, N.C., the assignee of the present invention, and methods for producing are described, for example, in U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,592,501, the contents of which are also incorporated herein by reference in their entirety.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

Returning to FIG. 1, a channel layer 12 is provided on the substrate 10. The channel layer 12 may be deposited on the substrate 10 using buffer layers, transition layers, and/or nucleation layers as described above. The channel layer 12 may be under compressive strain. Furthermore, the channel layer 12 and/or buffer nucleation and/or transition layers may be deposited by MOCVD or by other techniques known to those of skill in the art, such as MBE or HVPE.

In some embodiments of the present invention, the channel layer 12 is a Group III-nitride, and, in particular GaN. The channel layer 12 may be undoped ("unintentionally doped") and may be grown to a thickness of greater than about 20 Å. In particular embodiments of the present invention, the channel layer 12 is GaN and has a thickness of about 2 μm.

A barrier layer is provided on the channel layer 12. The channel layer 12 may have a bandgap that is less than the bandgap of the barrier layer and the channel layer 12 may also have a larger electron affinity than the barrier layer. The barrier layer may be deposited on the channel layer 12. In certain embodiments of the present invention, the barrier layer is provide by an AlN layer 14 and an AlGaN layer 16. Examples of layers according to certain embodiments of the present invention are described in U.S. Patent Publication No. 2002/0167023A1, to Smorchkova et al., entitled "GROUP-III NITRIDE BASED HIGH ELECTRON MOBILITY TRANSISTOR (HEMT) WITH BARRIER/SPACER LAYER" the disclosure of which is incorporated herein by reference as if set forth fully herein. In particular embodiments of the present invention, the barrier layer is thick enough and has a high enough Al composition and doping to induce a significant carrier concentration at the interface between the channel layer 12 and the barrier layer through polarization effects. In particular embodiments of the present invention, the barrier layer comprises an AlN layer having a thickness of about 0.8 nm and an AlGaN layer having 24% Al and a thickness of about 250 Å.

A gate contact 18 is provided on the barrier layer and, in particular, on the AlGaN layer 16. Source and drain contacts 20 and 22 are provided as ohmic contacts on the AlGaN layer 16. Ohmic contacts are processed (e.g, sintering) to have low resistivity connection through the barrier layer to the channel layer. A SiN layer 24 is provided on the exposed portions of the AlGaN layer 16 and the gate contact 18. References to SiN, SiON, $SiO_x$, MgN and the like refer to stoichiometric and/or non-stoichiometric materials. A field plate 26 is provided on the SiN layer 24 and is electrically connected to the gate contact 18. Transistors with field plates and methods of fabricating such transistors are described, for example, in U.S. patent application Ser. No. 10/930,160, filed Aug. 31, 2004 and entitled "WIDE BANDGAP TRANSISTOR DEVICES WITH FIELD PLATES", U.S. patent application Ser. No. 10/856,098, filed May 28, 2004 and entitled "CASCODE AMPLIFIER STRUCTURES INCLUDING WIDE BANDGAP FIELD EFFECT TRANSISTOR WITH FIELD PLATE" and International Application Number PCT/US04/29324, filed Sep. 9, 2004 and entitled "FABRICATION OF SINGLE OR MULTIPLE GATE FIELD PLATES," the disclosures of which are incorporated herein by reference as if set forth in their entirety.

In FIG. 1, the distance from the gate contact 18 to the source contact 20 is indicated as $L_{GS}$, the length of the gate contact 18 is indicated as $L_G$ and is referred to herein as the gate length. The distance the field plate 26 extends beyond the gate contact 18 is indicated as $L_F$ and is referred to herein as the field plate length. The distance from the field plate 26 to the drain contact 22 is indicated as $L_{FD}$. The thickness of the SiN layer 24 is indicated as t. The dimension of the gate contact 18 extending into and out of the page in FIG. 1 is referred to herein as the gate width $W_G$. Power density is used herein to normalize device characteristics across different size devices. Power density is referred to as W/mm of gate width or merely W/mm.

Particular embodiments of the structure of FIG. 1 will now be described in further detail. In some embodiments, after a HEMT with a conventional gate is fabricated, a layer of SiN is deposited on the wafer surface. Additional lithography is then performed to place a metal plate covering the gate and extending to the access region on the drain side. In some embodiments, the metal plate may be provided as described in Chini et al., IEEE Electron Device Lett., vol. 25, No. 5, pp. 229–231, May, 2004, the disclosure of which is incorporated herein by reference as if set forth in its entirety. This metal plate is electrically connected to the gate on the gate pad in a third dimension outside of the active channel region. The metal plate tracks the potential of the gate electrode. The function of the field plate is to reshape the distribution of the electric field on the drain side of the gate edge and to reduce its peak value. This not only increases device breakdown voltage but also reduces the high-field trapping effect, hence enhancing current-voltage swings at high frequencies. The trade-off of the field plate structure includes addition of the gate-drain capacitance at low voltages and extension of the gate-drain depletion length at high voltages, which reduces gain.

Gate length ($L_G$) determines the transit time under the gate. The SiN thickness (t) controls the onset voltage for additional channel depletion under the field plate while the field-plate length ($L_F$) dictates the size of the field-reshaping region. To maintain good frequency performance, a basic design guideline is to limit the addition of capacitance by the field plate to 10–15% of the original gate capacitance. With an $L_G$ of 0.5–0.6 μm and an AlGaN thickness of about 250 Å, t was chosen as 2000 Å and $L_F$ was varied from 0 to 1.1 m. The separation between the field plate and the drain ($L_{FD}$) was set to >2 μm to avoid premature breakdown. The gate to source distance $L_{GS}$ was set to 1 μm.

Except as described herein, the epi-structure and processing steps for fabricating the exemplary devices may be carried out using conventional fabrication techniques, such as those described in Wu et al., IEDM Tech Dig., Dec. 2–5, 2001, pp. 378–380, the disclosure of which is incorporated herein by reference as if set forth in its entirety. In contrast to a conventional AlGaN—GaN HEMT, the exemplary devices according to some embodiments of the present invention included a thin AlN barrier layer 14 adjacent to the GaN channel 12. It has been found this AlN barrier layer offers significant advantage over the conventional AlGaN barrier, simultaneously providing higher sheet charge density and mobility as described in U.S. Patent Publication No. 2002/0167023A1, to Smorchkova et al., entitled "GROUP-III NITRIDE BASED HIGH ELECTRON MOBILITY TRANSISTOR (HEMT) WITH BARRIER/SPACER LAYER" the disclosure of which is incorporated herein by reference as if set forth fully herein. Additionally, Fe doping of the GaN buffer was used in a manner similar to that described in Heikman et al., Appl. Phys. Lett., vol. 81, pp. 439–441, July 2002, the disclosure of which is incorporated herein by reference as if set forth in its entirety. In particular, the GaN buffer layer was doped with $2\times10^{17}/cm^3$ of Fe for a thickness of about 1 μm.

The field plate comprises 100 Å Ti and 5000 Å Au by e-beam evaporation. The sheet resistance was measured to be 265 Ω/□ by on-wafer TLM patterns, which is an equivalent of a sheet-density-mobility (nμ) product of $2.36\times10^{16}$ $(Vs)^{-1}$.

Thus, in summary, the devices of FIG. 1 included a semi-insulating SiC substrate 10, such as those provided by Cree, Inc. A GaN layer 12 is provided on the SiC substrate 10 and has a thickness of about 2 μm. About 1 μm of the GaN layer 12 is doped with Fe to a concentration of about $2\times10^{17}/cm^3$. An AlN layer 14 is provided on the GaN layer 12 and has a thickness of about 0.8 nm. An AlGaN layer 16 with about 24% Al is provided on the AlN layer 14 and has a thickness of about 250 Å. A SiN layer 24 is provided on the AlGaN layer 16 and has a thickness of about 2000–3000 Å. The source and drain contacts 20 and 22 are provided on the AlGaN layer 16 and are comprised of Ti/Al/Ni/Au with a total thickness of about 2000 Å. The gate contact 18 is also provided on the AlGaN layer 16 and is Ni/Au with a total thickness of about 4500 Å. The field plate 26 is provided on the SiN layer 24 and is 100 Å Ti and 5000 Å Au. Furthermore, $L_{GS}$ for the exemplary devices is 1 μm, $L_G$ is from 0.5 to 0.6 μm, $L_F$ is varied from 0 to 1.1 μm and $L_{FD}$ is 2–3 μm.

Figure 13:
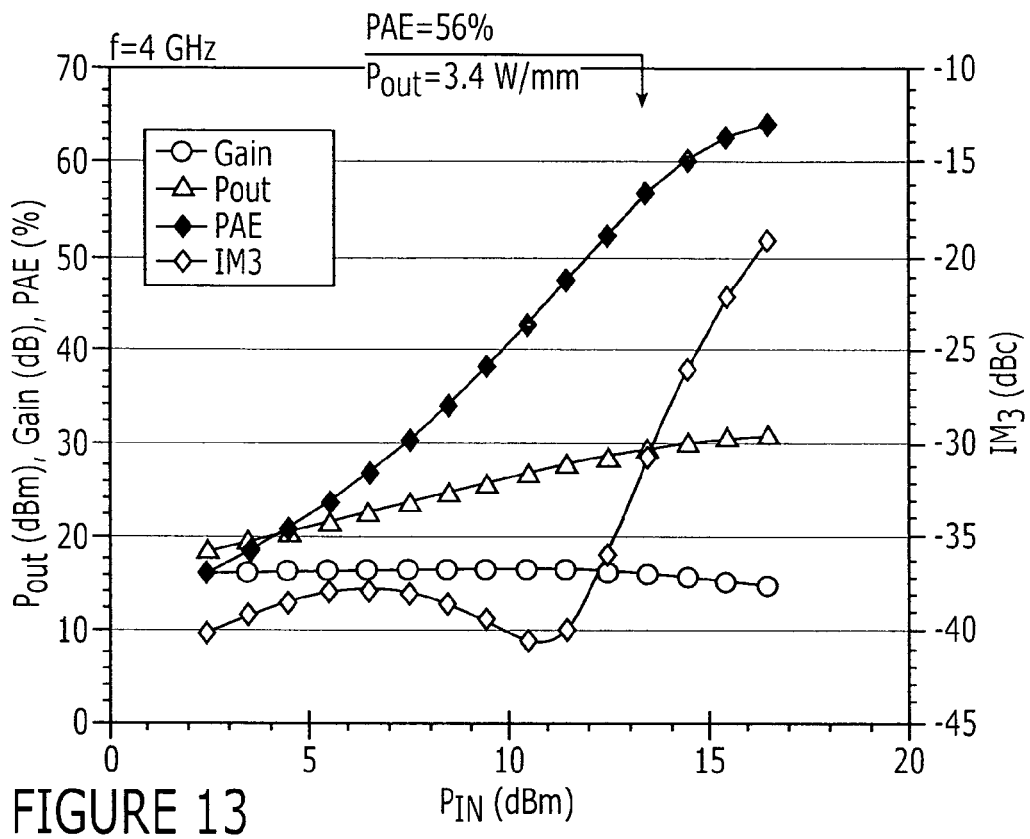
FIG. 13 is a graph of linearity performance of a device without a field plate $V_{DS}$=48V and $I_Q$=20 mA/mm, which achieved a 56% PAE at −30 dBc IM$_3$ with associated power of 3.4 W/mm. The device dimensions were 0.5×246 μm$^2$ with $L_G$ =0.5 μm and $L_{GS}$=1 μm. Single tone power at 3 dB compression was $P_{3dB}$=8 W/mm with PAE=70%.

Unless indicated otherwise, the devices discussed below with reference to FIGS. 2 through 14 are devices having the above described structure, other than FIG. 13 is a graph of performance of a device as described above but without a field plate. Performance of exemplary devices as described herein will now be described. However, embodiments of the present invention should not be construed as limited to these particular devices but includes other devices capable of providing the performance characteristics described herein. Furthermore, while various theories of operation are described herein, embodiments of the present invention should not be construed as limited to a particular theory of operation.

Device Performance

Power Density and PAE

A typical device, as described above, exhibited a low on-resistance of 2.1–2.3 Ω-mm owing to both the high n-μ product in the channel and a low resistance ohmic contact of 0.4 Ω-mm. The channel pinched off at a gate-source bias ($V_{GS}$) of −4 V and the maximum current exceeded 1200 mA/mm at $V_{GS}$ of 2 V (see FIG. 11). Comparison of current-voltage(I–V) characteristics of the devices with different field-plate dimensions revealed little difference at low voltages. At high voltages, larger $L_F$ reduced sub-threshold leakage, which helps extend the current-voltage swing. The dc breakdown voltage was about 140 V for $L_F$=0 and >170 V for LF=0.7 to 1.1 µm.

Figure 2:
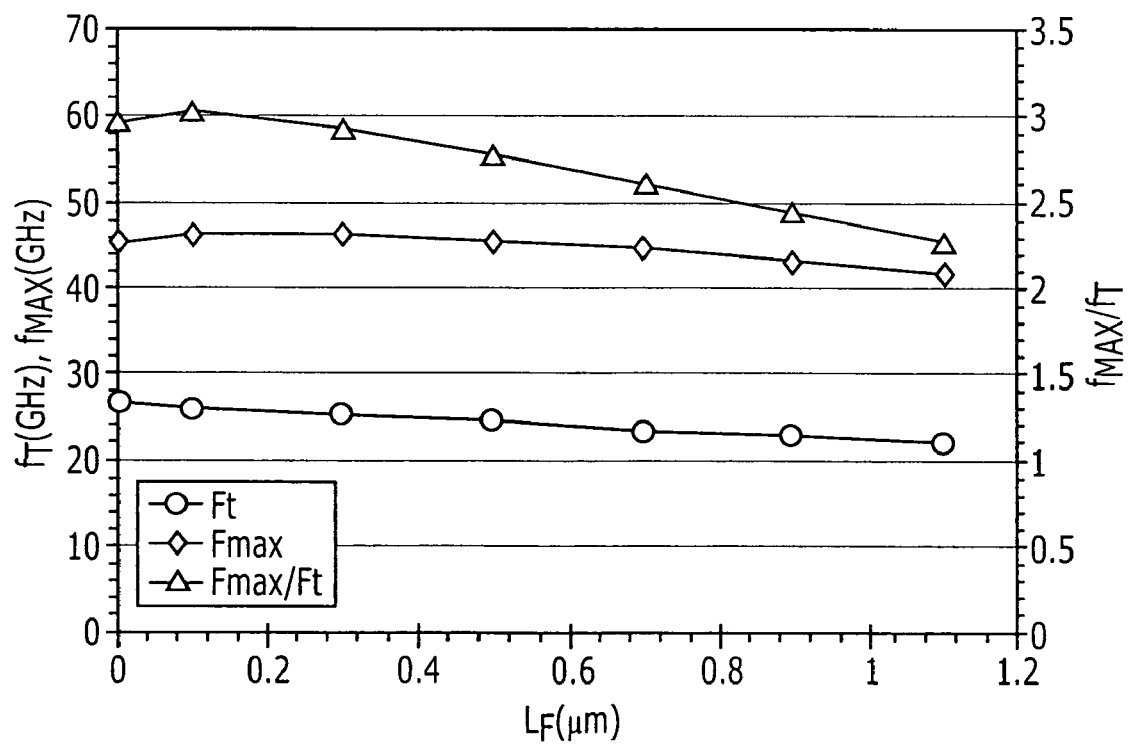
FIG. 2 is a graph of current-gain and power-gain cutoff frequencies, $f_t$ and $f_{MAX}$, as a function of field plate dimension $L_F$. The devices were biased at $V_{DS}$=10 V and $I_D$=300 mA/mm, where the best $f_t$ is typically located. Gate length and width were 0.55 μm and 2×123 μm with $L_{GS}$=1 μm and $L_{FD}$>2 μm.

Small-signal characterization was performed with a bias optimum for current-gain cutoff frequency ($f_t$) and is shown in FIG. 2. Due to the increase in the gate-drain capacitance, $f_t$ decreases from 26.2 to 21.8 GHz from $L_F$=0 to LF=1.1 µm, a rate of 4 GHz per µm, or 16% per µm. This is much less than the rate of decrease in $f_t$ at 23.6 GHz per µm if the actual gate length, $L_G$, were extended from 0.55 µm to 1.1 µm. The power-gain cutoff frequency ($f_{MAX}$), however, increases slightly at first and then drops at a rate of 27% per µm after $L_F$>0.3 µm. The initial enhancement is due to the increased gate conductance by the relatively large Au field plate on top of the gate. As a result, the $f_{MAX}/f_t$ ratio shows a more gradual decrease as $L_F$ increases.

Figure 9:
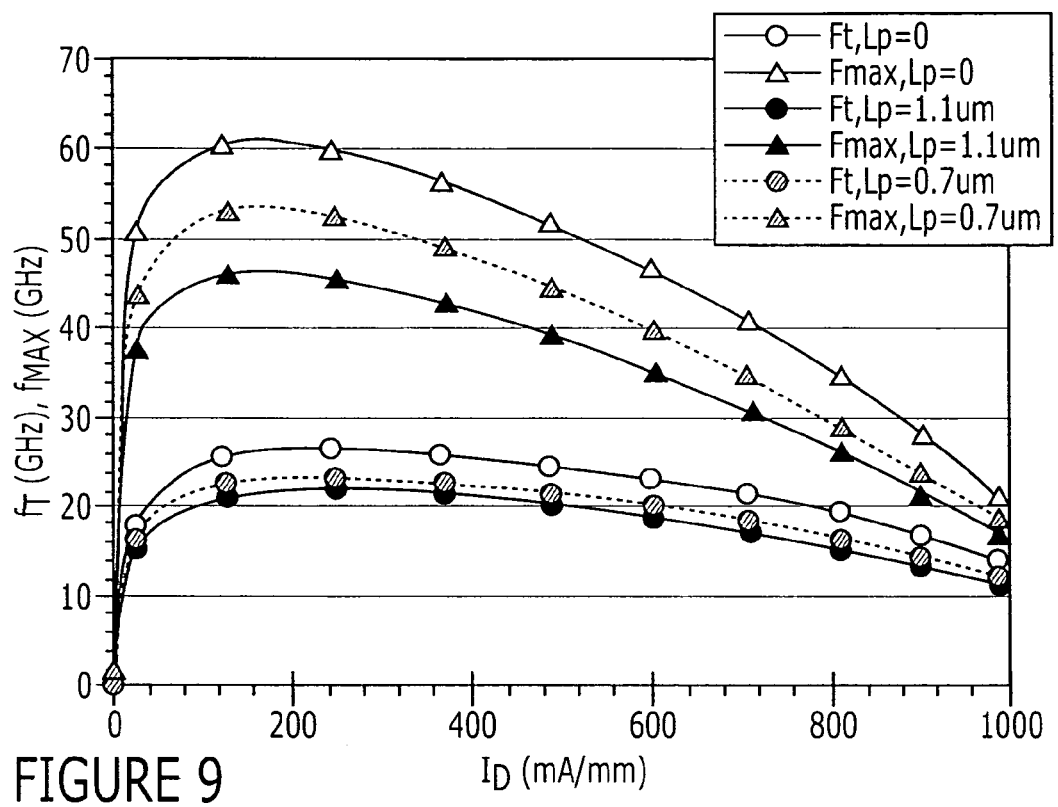
FIGS. 9 and 10 are graphs of cutoff frequency versus bias current and voltage respectively for devices with a field plate length $L_F$ (labeled Lp in FIGS. 10 and 11) ranging from 0 to 1.1 μm, $L_G$=0.5 μm, $L_{GS}$=1 μm and $L_{FD}$>2 μm.
Figure 10:
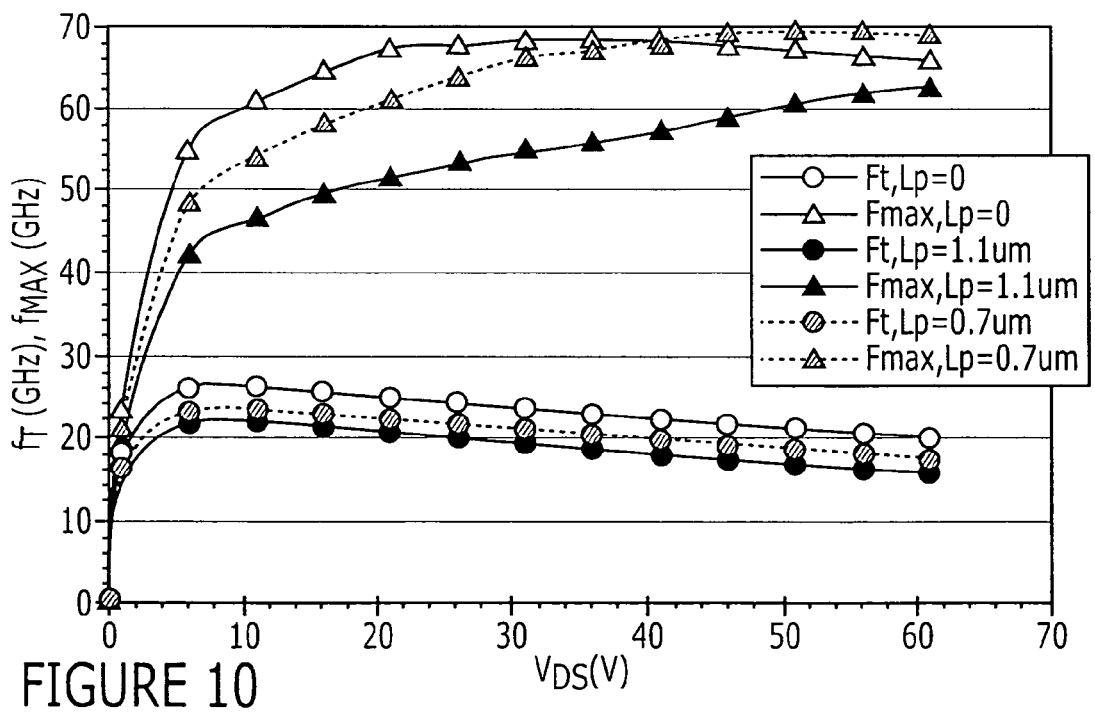
Figure 11:
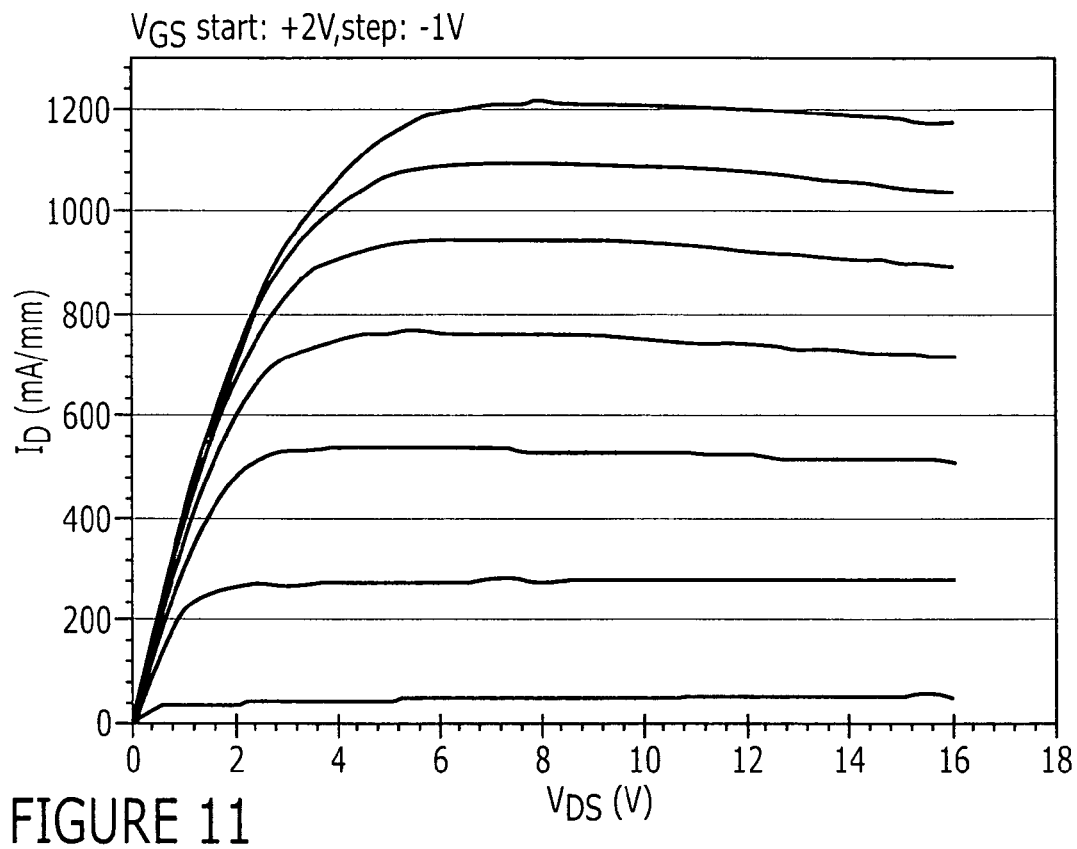
FIG. 11 is a graph of current versus voltage characteristics for devices according to some embodiments of the present invention. The devices of FIG. 11 have a very-high nμ product: 2350×10$^{13}$ (Vs)$^{-1}$, low on-resistance: 2.1–2.3 Ω-mm and $I_{D,MAX}$>1200 mA/mm. For the devices of FIG. 11, $L_F$=0.7 μm, $L_G$=0.5 μm, $L_{GS}$=1 μm and $L_{FD}$=2 μm.
Figure 12:
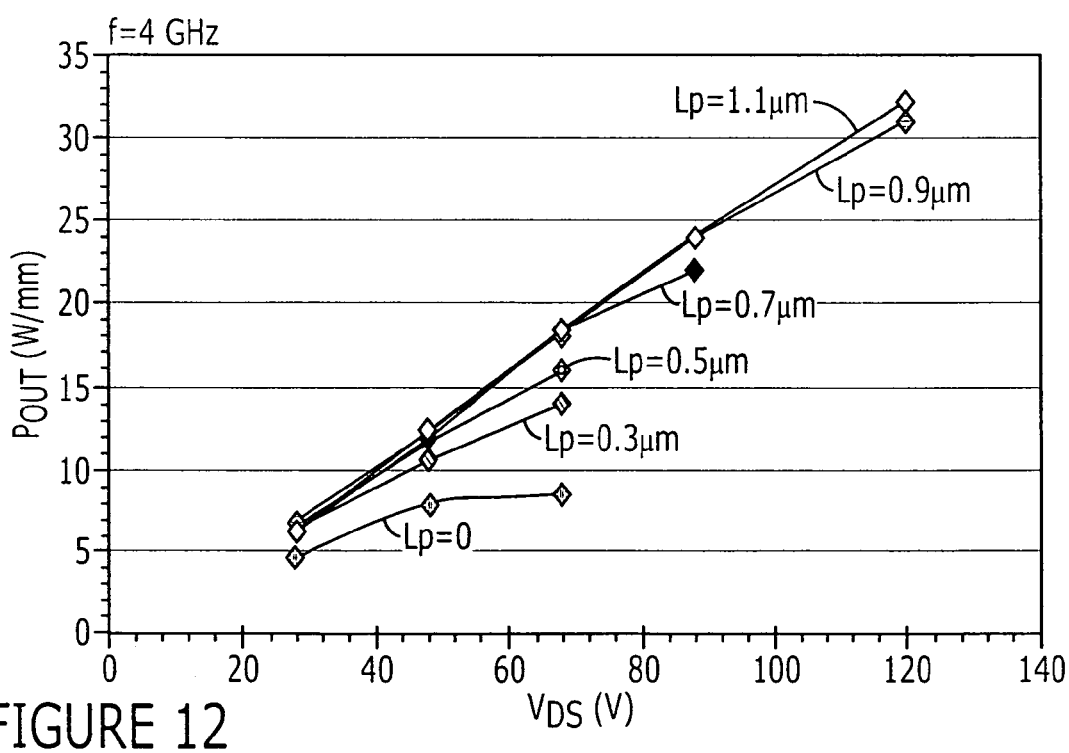
FIG. 12 is a graph of power performance versus $L_F$ at increasing voltages with $L_G$=0.5 μm, $L_{GS}$=1 μm and $L_{FD}$>2 μm.

At higher voltages, $f_t$ decreased slowly but persistently. In contrast, $f_{MAX}$ increased with increase in voltage, reaching a peak and slowly coming down. Such enhancement in $f_{MAX}$ was maintained up to much higher voltages for devices with longer field plates, which should aid their performance at high biases as also pointed out by Ando et al. This phenomenon may be due to the reduction of both the gate-drain capacitance and the output conductance as the channel under the field plate depletes with increase in drain voltage. The peak $f_{MAX}$ was measured as 68 GHz at 36 V for $L_F$=0, 69 GHz at 51 V for $L_F$=0.7 µm, and at >61 GHz at >61 V for $L_F$=1.1 µm. Such a relationship is seen in FIGS. 9 and 10, which are graphs of cutoff frequency versus bias current and voltage respectively for devices with a field plate length $L_F$ (labeled Lp in FIGS. 9 and 10) ranging from 0 to 1.1 µm.

Figure 3:
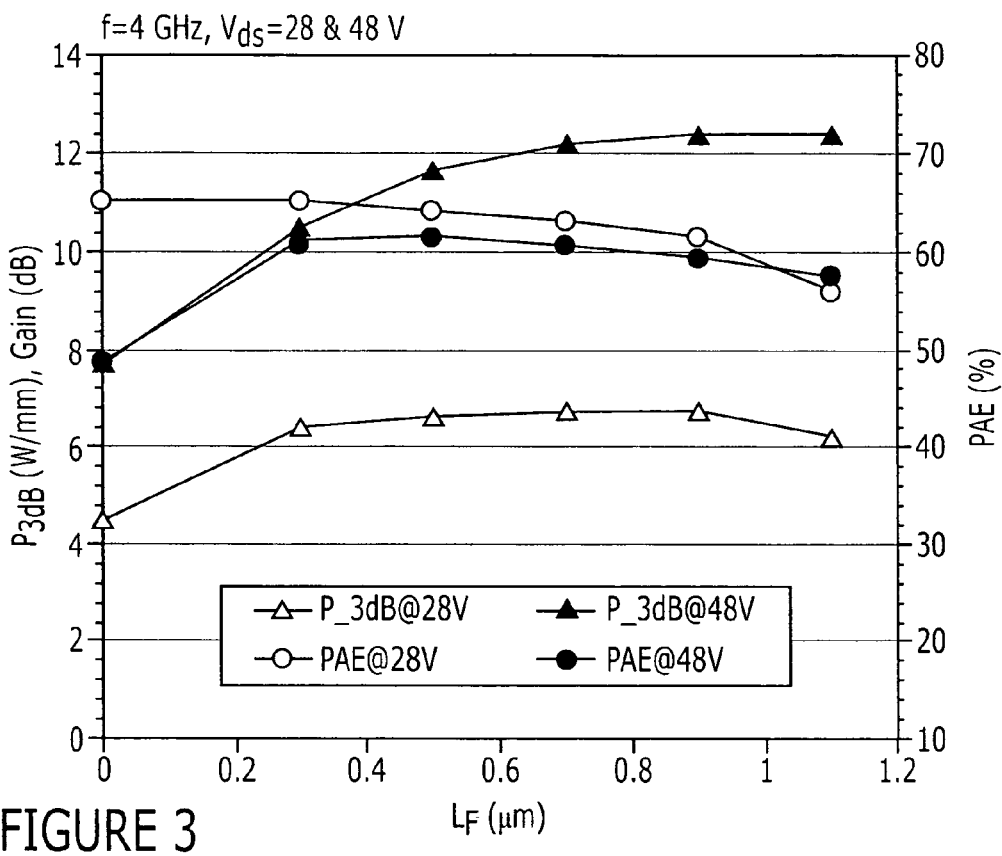
FIG. 3 is a graph of power performance versus length of field plate $L_F$ when measured at 4 GHz with drain biases of 28 and 48 V for the devices of FIG. 2.

Power performance was first evaluated using a Focus load-pull system with maximum reflection coefficient of 0.75–0.77. The matching was tuned for best combination of output power at 3 dB compression ($P_{3\ dB}$) and the power-added efficiency (PAE). FIG. 3 summarizes the measurement result at 4 GHz where gain is less of a limiting factor. A lower bias of 28 V and a higher bias of 48 V were chosen to examine the effect of the field plate. The enhancement in output power is readily evident even at 28 V. Addition of a 0.3-µm-long field plate boosts $P_{3\ dB}$ from 4.5 to 6.4 W/mm. Devices with larger $L_F$ also deliver high power but with a gradual degradation in PAE owing to the lower gain. The device without a field plate ($L_F$=0) is clearly not limited by breakdown at 28 V bias as seen by all evidence including the gate current monitored during the measurement. Hence, the benefit from a field plate is attributed to reduced trapping through reduction in peak electric field. As the drain bias steps up to 48 V, the enhancement by the field plate becomes more significant for both $P_{3\ dB}$ and PAE. $P_{3\ dB}$ increases from 7.8 W/mm for $L_F$=0 to 10.6 W/mm for $L_F$=0.3 µm, and saturates at 12.4 W/mm for $L_F$>0.9 µm. PAE also rises from 47.2% for $L_F$=0 to 61% for $L_F$=0.5 and 0.7 µm and slowly reduces to 57.5% at $L_F$=1.1 µm. The optimum $L_F$ for the best combination of and PAE at 48 V and 4 GHz has a broad range centered at 0.6 µm. When drain bias further increased to 68 V, devices without a field plate suffered severe degradation in PAE with little increase in output power. The optimal $L_F$ moved upward to 0.7–0.9 µm, with which $P_{3\ dB}$ of 18–18.5 W/mm and PAE of 54% were obtained. At 88 V, the optimum $L_F$ further increased to 0.9–1.1 m and yielded $P_{3\ dB}$ of 24 W/mm with PAE of 48%. Beyond 88 V the Focus load-pull system failed to properly match these 246-µm-wide devices.

Figure 4:
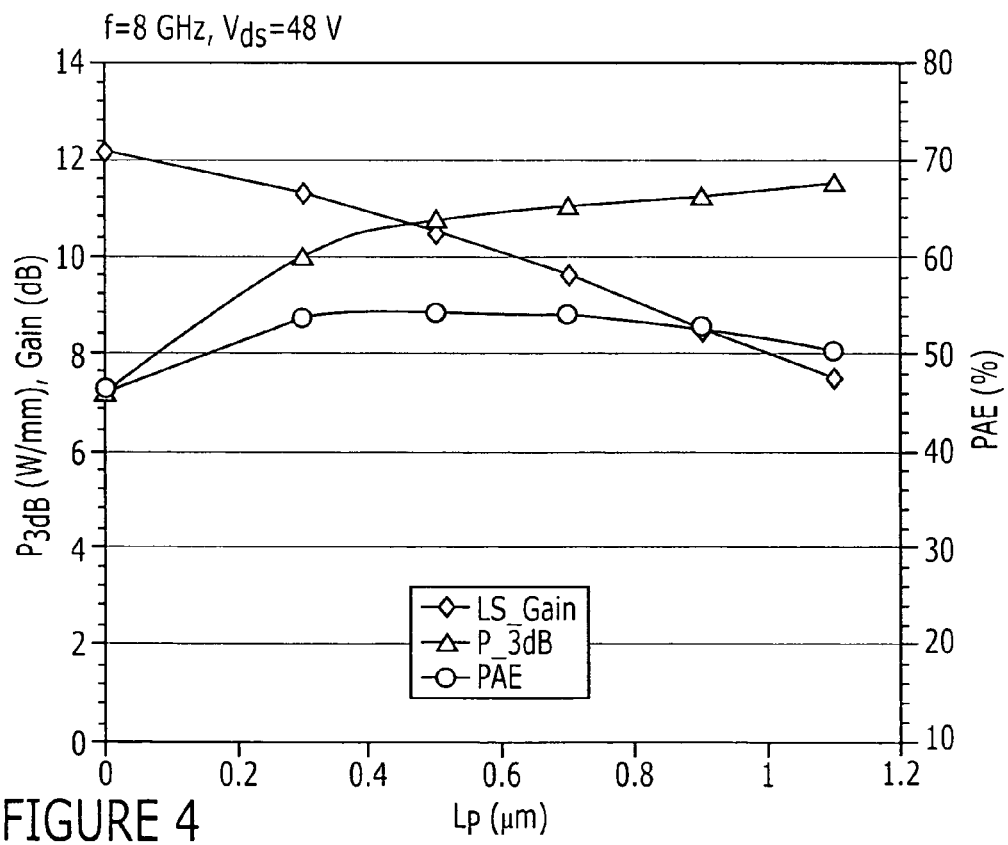
FIG. 4 is a graph of power performance and large signal gain versus length of field plate $L_F$ when measured at 8 GHz with drain bias of 48 V for the devices of FIG. 2.

The devices with different $L_F$ values were also measured at 8 GHz as illustrated in FIG. 4. Because power gain plays a more important role at this higher frequency, it may be expected that devices with larger $L_F$ values may fail to perform well. While it is confirmed that large-signal power gain did degrade from 11.6 to 7.6 dB from $L_F$=0 to $L_F$=1.1 µm when biased at 48 V, the $P_{3\ dB}$ actually increased from 7.3 W/mm for $L_F$=0 to 10 W/mm for $L_F$=0.3 µm and continuously rose all the way to 11.5 W/mm for $L_F$=1.1 µm. This monotonic increase in is not as pronounced at 4 GHz. An explanation may be that all devices have the same transit time under the gate because of the identical gate length $L_G$. The cause of gain reduction may be from the additional gate-drain capacitance by the field plate. This capacitor provides a path for the Miller feedback (a negative current feedback). While it reduces gain and has a stronger effect at higher frequencies (due to the reduced capacitive reactance), it also offers some linearization effect and apparently reduces gain compression for large $L_F$ values. As an overall result, at 8 GHz, the optimum $L_F$ value for the best combination of and PAE at increasing applied voltages is similar to the 4-GHz result, probably shifting down by about 0.1–0.2 µm if a simultaneous higher gain is also preferred.

Figure 5:
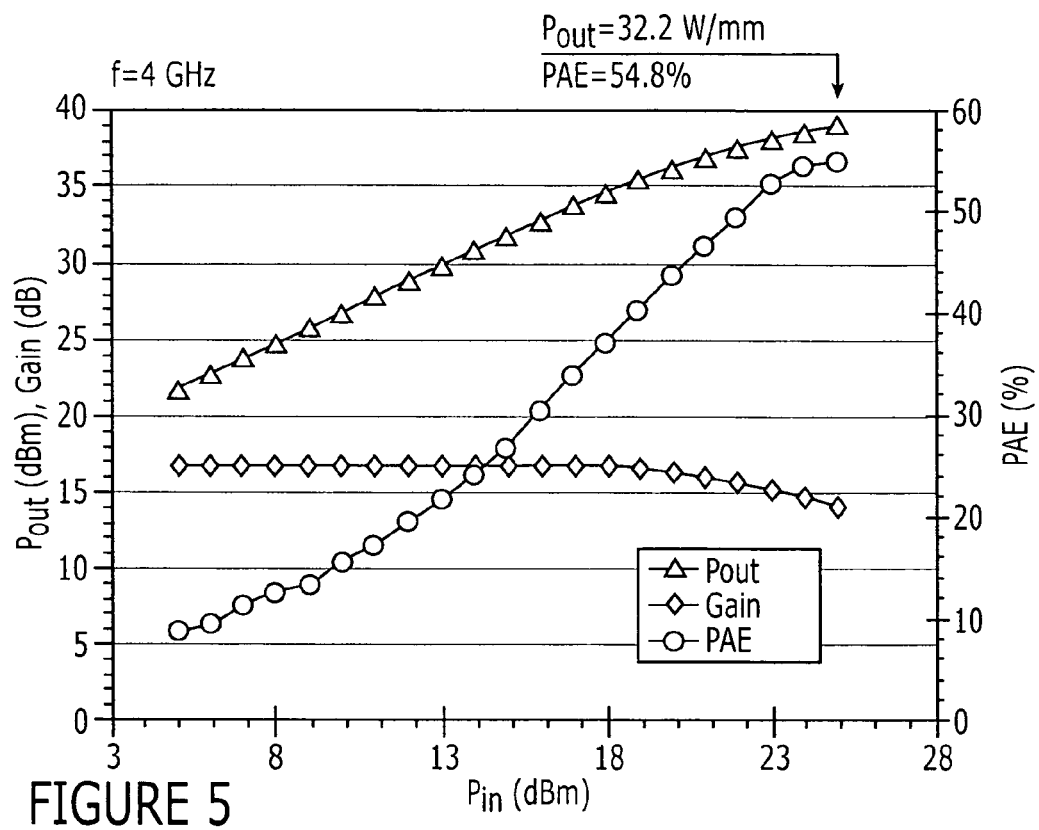
FIG. 5 is a power sweep graph at 4 GHz for 246-μm-wide devices showing 32.2 W/mm power density and 54.8% power added efficiency (PAE) when biased at 120 V. Linear gain is 16.9 dB and associated large-signal gain is 14 dB. Device dimensions: $L_{GS}$=1 μm, $L_G$=0.55 μm; $L_F$=1.1 μm, and $L_{FD}$=3 μm.
Figure 6:
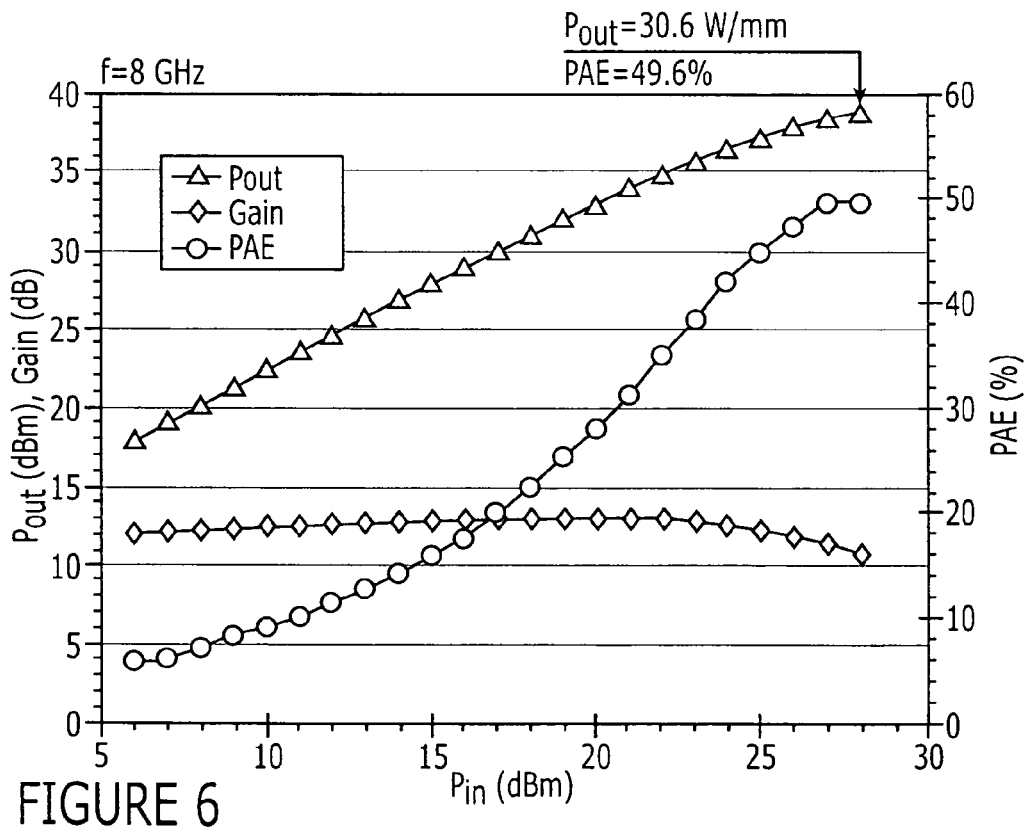
FIG. 6 is a power sweep graph at 8 GHz for 246-μm-wide devices showing 30.6 W/mm power density and 49.6% PAE when biased at 120 V. Linear gain is 10.7 dB (−2.3 dB compression). Device dimensions: $L_{GS}$=1 μm, $L_G$=0.55 μm; $L_F$=0.9 μm, and $L_{FD}$=3 μm.

Finally, a Maury load-pull system with a higher maximum reflection coefficient of 0.88 was employed to further test the ultimate potential of the field-plate devices. The Maury system not only was able to verify previous results but also provided more flexibility to tradeoff between $P_{3\ dB}$ and PAE. For example, at 4 GHz and 88 V, the devices could be tuned to yield 20 W/mm and 60% PAE. Devices with $L_F$ of 0.9–1.1 µm and $L_{FD}$ of 3 µm were able to operate up to 120 V bias (see FIG. 12 where $L_F$ is labeled as $L_p$). The continuous wave (CW) power sweep at 4 GHz for a device with $L_F$=1.1 µm is shown in FIG. 5. The device was measured on wafer at room temperature with deep class-AB bias. The linear gain is 16.8 dB. At an input level of 25 dBm, the output power reached 39.0 dBm, or 32.2 W/mm, with associated gain and PAE of 14 dB and 54.8%, respectively. A device with the same dimensions except for a smaller $L_F$ of 0.9 µm was also tested at 8 GHz and 120 V. As seen in FIG. 6, the device generated 30.6 W/mm output power at 2.2-dB compression, along with associated PAE and power gain of 49.6% and 10.7 dB, respectively. These power levels of >30 W/mm at C and X bands are a dramatic improvement over previous state-of-the-art of 10–12 W/mm with conventional gate structures. This ultra-high performance may be an accumulative result of the very-high nµ-product epi-design using an AlN barrier, low resistance ohmic contacts, and optimization of field-plate dimensions.

As evidenced by the above discussion, the field plate may offer benefits far out-weighing its apparent drawback of gain reduction. The advantage is maintained up to X band using a half-micron primary gate dimension by optical lithography. With 0.55-µm-long gate and 2000-Å-thick SiN as the field plate dielectric, optimum length of the plate at both 4 GHz and 8 GHz was found to increase with operating voltage from 0.3–0.5 µm at 28 V to 0.9–1.1 µm at 88–120 V. The window for the plate length was wide. Devices with field plates larger than the optimum still performed well with some compromise in gain.

Devices optimized for high-voltage operation could be biased up to 120 V. A 246-µm-wide device with a 1.1-µm-long field plate and 3 µm field-plate-to-drain separation achieved a CW power density of 32.2 W/mm at 4 GHz with associated gain of 14 dB and PAE of 54.8%. A device with the same dimensions except for a shorter field plate of 0.9 m demonstrated 30.6 W/mm at 8 GHz with associated gain and PAE of 10.7 dB and 49.6%, respectively.

Linearity

Linearity performance of GaN-channel HEMTs with various field plate lengths at biases up to 108 V was also evaluated. As with the devices above, the device epi-layers consisted of a GaN buffer with Fe doping, a thin AlN interlayer and an AlGaN barrier, all grown on semi-insulating SiC substrates by Metal-Organic-Chemical-Deposition. The device structure and the process was nominally similar to that described earlier. The SiN passivation layer thickness was 3000 Å. The gate dimensions were 0.5×246 µm². The filed plate, which was electrically connected to the gate, was placed on top of the SiN passivation layer over the gate extending to the drain side. The lengths of the field plate ($L_F$), defined as the extension of the FP over the gate edge on the drain side, were set at 0, 0.7 and 1.1 µm.

Figure 7:
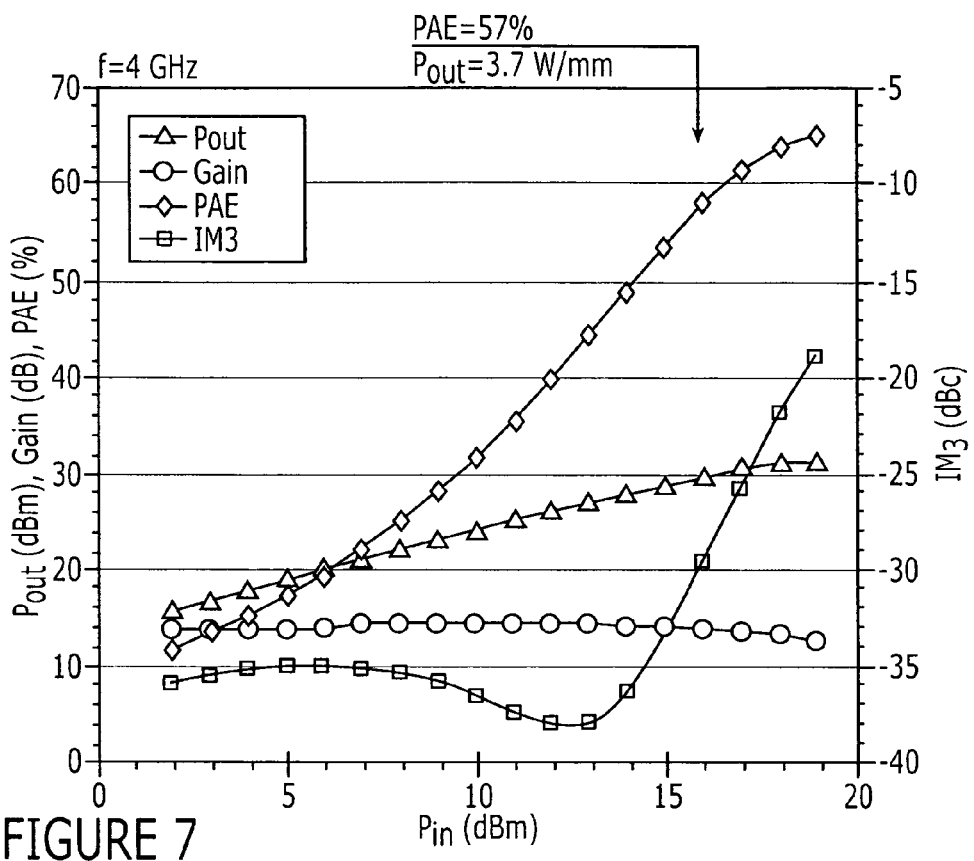
FIG. 7 is a graph of linearity performance of a device with $L_F$=0.7 μm at $V_{DS}$=48V and $I_Q$=20 mA/mm, which achieved a 57% PAE at −30 dBc IM$_3$ with associated power of 3.7 W/mm. The device dimensions were 0.5×246 μm$^2$ with $L_G$=0.5 μm, $L_{GS}$=1 μm and $L_{FD}$=2 μm. Single tone power at 3 dB compression was $P_{3dB}$=8.8 W/mm with PAE=71%.
Figure 8:
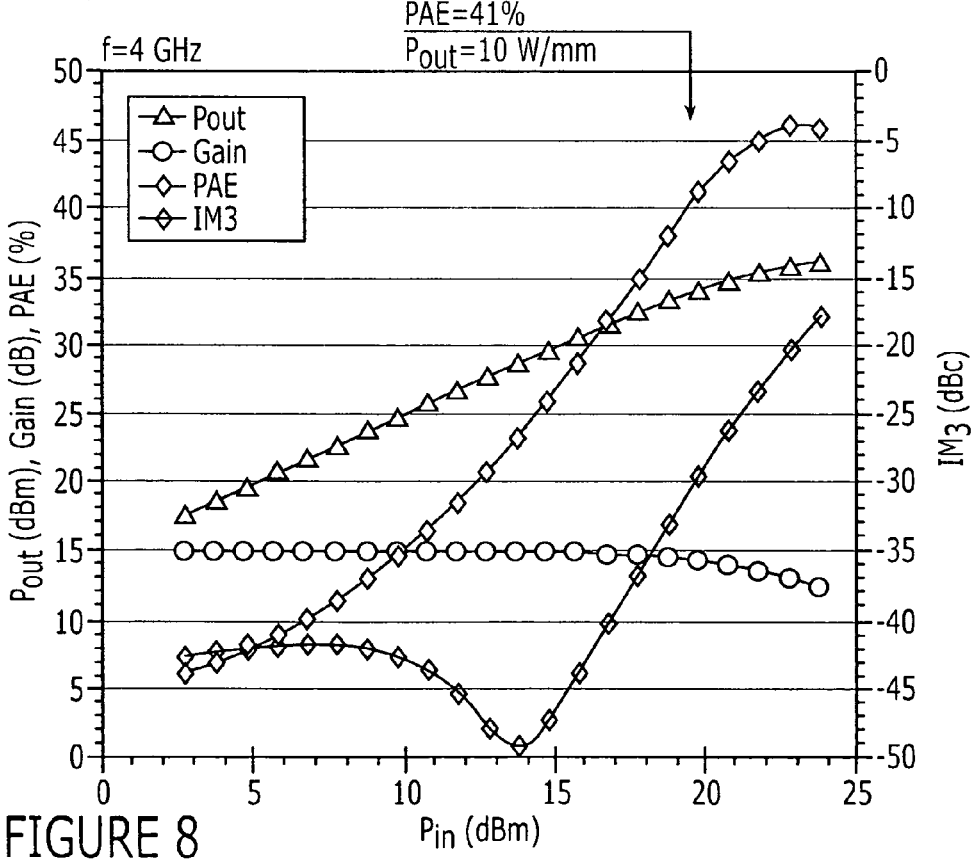
FIG. 8 is a graph of linearity performance of a device with $L_F$=1.1 μm at $V_{DS}$=108V and $I_Q$=20 mA/mm, which achieved a 41% PAE at −30 dBc IM$_3$ with associated power of 10 W/mm. The device dimensions were 0.5×246 μm$^2$ with $L_G$=0.5 μm, $L_{GS}$=1 μm and $L_{FD}$=3 μm. Single tone power at 3 dB compression was $P_{3dB}$=24 W/mm with PAE=48%.

Both the non-field plate and field plate devices had similar dc characteristics including 1 A/mm open-channel current and a −4 V gate pinch-off voltage. However, the field plate device showed higher breakdown voltages of >140 V compared to ~100 V for the non-field plate devices. When cutoff frequencies were investigated against bias current, all devices showed extremely sharp turn-on in power-gain cutoff frequencies ($F_{max}$) as the device channel opened up. FIG. 9 illustrates such characteristics. Such gain characteristics are well suited for class B/deep class-AB operation for high efficiency. When biased at 48 V with a small quiescent current of 20 mA/mm and driven by a 2-tone signal with 100 kHz spacing at 4 GHz, a non-field plate device generated 3.4 W/mm with 56% PAE and 15.8 dB gain at $IM_3$ of −30 dBc (see FIG. 13). The field plate devices showed improved linear power due to the benefit of field shaping. However, as $L_F$ increased, gain reduced, which affected PAE. As a compromise, $L_F$=0.7 µm was found optimum at this bias voltage, achieving a linear power density of 3.7 W/mm with 57% PAE and 13.7 dB gain at $IM_3$ of −30 dBc as seen in FIG. 7. A more significant advantage of the field plate devices is their capability for higher voltage operation. At 78 V, 7 W/mm linear power was obtained with 50% PAE and 15.2 dB gain from a device with $L_F$=0.7 µm. With further increased bias voltages, a longer $L_F$ was needed. At 108 V, a device with $L_F$=1.1 µm produced 10 W/mm linear power with 41% PAE and 14.3 dB gain at $IM_3$ of −30 dBc as seen in FIG. 8.

Figure 14:
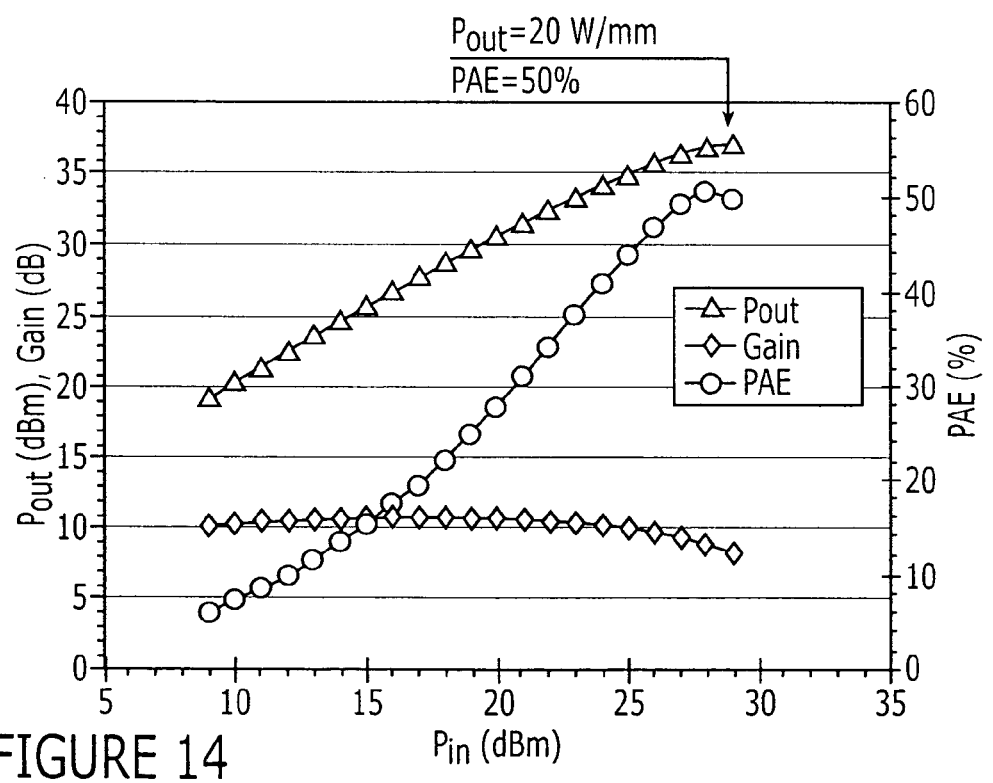
FIG. 14 is a graph of performance of a device with a field plate at 10 GHz, $V_{DS}$=70V and $I_Q$=20 mA/mm, which achieved a 50% PAE with associated power density of 20 W/mm. The device dimensions were a gate width $W_G$ of 246 μm, $L_F$=0.7 μm, $L_{FD}$=2 μm, $L_G$=0.5 μm and $L_{GS}$=1 μm.

FIG. 14 illustrates linearity performance at 10 GHz. FIG. 14 is a graph of performance of a device with a field plate at 10 GHz, $V_{DS}$=70V and $I_Q$=20 mA/mm, which achieved a 50% PAE with associated power density of 20 W/mm. The device dimensions were a gate width $W_G$ of 0.25 mm, $L_G$=0.5 µm. Single tone power at 3 dB compression was $P_{3dB}$=8 W/mm with PAE=70%.

While embodiments of the present invention have been described herein with reference to particular HEMT structures, the present invention should not be construed as limited to such structures. For example, additional layers may be included in the HEMT device while still benefiting from the teachings of the present invention. Such additional layers may include GaN cap layers, as for example, described in Yu et al., "Schottky barrier engineering in III–V nitrides via the piezoelectric effect," Applied Physics Letters, Vol. 73, No. 13, 1998, or in U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," the disclosures of which are incorporated herein by reference as if set forth fully herein.

In the drawings and specification, there have been disclosed typical embodiments of the invention, and, although specific terms have been employed, they have been used in a generic and descriptive sense only and not for purposes of limitation.

That which is claimed is:

1. A field effect transistor having a power density of greater than 25 W/mm when operated at a frequency of at least 4 GHz.

2. The field effect transistor of claim 1, wherein the power density is provided at a compression of not greater than 3 dB.

3. The field effect transistor of claim 1, wherein the power density is at least 30 W/mm when operated at 4 GHz.

4. The field effect transistor of claim 3, wherein the power density of at least 30 W/mm is provided at a drain voltage of 120 V.

5. The field effect transistor of claim 1, wherein the power density is at least 30 W/mm when operated at 8 GHz.

6. The field effect transistor of claim 5, wherein the power density of at least 30 W/mm is provided at a drain voltage of 120 V.

7. The field effect transistor of claim 1, wherein the transistor comprises a high electron mobility transistor (HEMT).

8. The field effect transistor of claim 7, wherein the transistor comprises a Group III-nitride HEMT.

9. The field effect transistor of claim 8, wherein the Group III-nitride HEMT comprises:
 a GaN channel layer;
 an AlN layer on the GaN channel layer;
 an AlGaN layer on the AlN layer;
 a gate contact on the AlGaN layer;
 source and drain contacts on the AlGaN layer;
 an insulating layer on the gate contact; and
 a field plate on the insulating layer and electrically coupled to the gate contact.

10. The field effect transistor of claim 9, wherein the field plate has a field plate length ($L_F$) of from about 0.3 µm to about 1.1 µm.

11. The field effect transistor of claim 10, wherein the field plate length is from 0.3–0.5 µm.

12. The field effect transistor of claim 10, wherein the field plate length is from 0.9–1.1 µm.

13. A field effect transistor having a power density of greater than 20 W/mm when operated at a frequency of at least 10 GHz.

14. The field effect transistor of claim 13, wherein the power density is provided at a compression of not greater than 3 dB.

15. The field effect transistor of claim 13, wherein the power density of greater than 20 W/mm is provided at a drain voltage of 70 V.

16. The field effect transistor of claim 15, wherein the transistor comprises a high electron mobility transistor (HEMT).

17. The field effect transistor of claim 16, wherein the transistor comprises a Group III-nitride HEMT.

18. The field effect transistor of claim 17, wherein the Group III-nitride HEMT comprises:
 a GaN channel layer;
 an AlN layer on the GaN channel layer;
 an AlGaN layer on the AlN layer;
 a gate contact on the AlGaN layer;

source and drain contacts on the AlGaN layer;
an insulating layer on the gate contact; and
a field plate on the insulating layer and electrically coupled to the gate contact.

19. The field effect transistor of claim 18, wherein the field plate has a field plate length ($L_F$) of from about 0.3 μm to about 1.1 μm.

20. The field effect transistor of claim 19, wherein the field plate length is from 0.3–0.5 μm.

21. The field effect transistor of claim 19, wherein the field plate length is from 0.9–1.1 μm.

22. A field effect transistor having a power density of at least 2.5 W/mm and a two tone linearity of at least −30 dBc of third order intermodulation distortion (IM3) at a center frequency of at least 4 GHz and a power added efficiency (PAE) of at least 40% with IM3 of at least −30 dBc.

23. The field effect transistor of claim 22, wherein the power density is provided at a compression of not greater than 3 dB.

24. The field effect transistor of claim 22, wherein the drain voltage power density is provided at a drain voltage of 48 V.

25. The field effect transistor of claim 22, wherein the PAE is at least 50%.

26. The field effect transistor of claim 22, wherein the power density is at least 5 W/mm with IM3 of at least −30 dBc.

27. The field effect transistor of claim 22, wherein the power density is provided at a drain voltage of 108 V.

28. The field effect transistor of claim 22, wherein the power density is at least 10 W/mm with IM3 of at least −30 dBc.

29. The field effect transistor of claim 28, wherein the power density is provided at a drain voltage of 108 V.

30. The field effect transistor of claim 22, wherein the transistor comprises a high electron mobility transistor (HEMT).

31. The field effect transistor of claim 30, wherein the transistor comprises a Group III-nitride HEMT.

32. The field effect transistor of claim 31, wherein the Group III-nitride HEMT comprises:
a GaN channel layer;
an AlN layer on the GaN channel layer;
an AlGaN layer on the AlN layer;
a gate contact on the AlGaN layer; and
source and drain contacts on the AlGaN layer.

33. The field effect transistor of claim 32, further comprising:
an insulating layer on the gate contact; and
a field plate on the insulating layer and electrically coupled to the gate contact.

34. The field effect transistor of claim 33, wherein the field plate has a field plate length ($L_F$) of from about 0.3 μm to about 1.1 μm.

35. The field effect transistor of claim 34, wherein the field plate length is about 0.7 μm.

* * * * *